United States Patent [19]
Gard

[11] Patent Number: 5,907,242
[45] Date of Patent: May 25, 1999

[54] BALANCED PASSIVE BANDPASS FILTER AND PREAMPLIFIER FOR A RECEIVER

[75] Inventor: Michael F. Gard, Perry, Okla.

[73] Assignee: The Charles Machine Works, Inc., Perry, Okla.

[21] Appl. No.: 08/712,092

[22] Filed: Sep. 20, 1996

Related U.S. Application Data

[63] Continuation of application No. 08/441,454, May 15, 1995, abandoned.

[51] Int. Cl.$^6$ .............................. G01V 3/08; H03H 7/00; H04B 1/18; H01Q 1/00
[52] U.S. Cl. .......................... 324/326; 324/335; 333/172; 343/722; 455/286; 455/290
[58] Field of Search ................. 324/67, 207.17, 324/207.18, 207.26, 239, 326, 335, 344–346; 175/45; 333/167, 172; 343/701, 722, 807; 455/193.2, 286, 290, 291, 339; 342/459; 340/854.1; 330/185, 306

[56] References Cited

U.S. PATENT DOCUMENTS

| | | | |
|---|---|---|---|
| 2,511,327 | 6/1950 | Bussard | 455/290 X |
| 3,019,335 | 1/1962 | Brilliant | 455/286 X |
| 4,008,477 | 2/1977 | Babij et al. | 343/701 |
| 4,691,165 | 9/1987 | Szedlmajer | 324/326 |
| 4,806,869 | 2/1989 | Chau et al. | 324/326 |
| 4,881,083 | 11/1989 | Chau et al. | 342/459 |
| 5,034,994 | 7/1991 | Muterspaugh et al. | |
| 5,155,442 | 10/1992 | Mercer | 324/690 |
| 5,231,408 | 7/1993 | Nakase | 455/286 X |
| 5,264,795 | 11/1993 | Rider | 324/326 |
| 5,337,002 | 8/1994 | Mercer | 324/326 |
| 5,438,266 | 8/1995 | Tsang | 324/326 |

FOREIGN PATENT DOCUMENTS

| | | | |
|---|---|---|---|
| 0262882 | 4/1988 | European Pat. Off. | |
| 1488847 | 10/1977 | United Kingdom | 324/67 |
| 2060304 | 4/1981 | United Kingdom | |

*Primary Examiner*—Gerard Strecker
*Attorney, Agent, or Firm*—Sidley & Austin

[57] ABSTRACT

A balanced bandpass preamplifier assembly (23) is disclosed for use in a locator (10) for locating a beacon transmitter (18) housed within an underground boring device (12). The bandpass preamplifier assembly (23) includes a balanced bandpass filter (28) of the Butterworth type with second order filter characteristics. The preamplifier assembly (23) provides reception of beacon frequencies at two distinct frequencies, preferably 29.430 KHz and 32.768 KHz. The antenna (14) of the locator (10) forms the series inductance in the bandpass filter (28).

24 Claims, 3 Drawing Sheets

BALANCED PASSIVE BANDPASS FILTER AND PREAMPLIFIER FOR A RECEIVER

CROSS REFERENCE TO RELATED APPLICATIONS

This is a continuation of U.S. patent application Ser. No. 08/441,454 filed May 15, 1995, now abandoned.

TECHNICAL FIELD OF THE INVENTION

This invention relates to a bandpass filtering preamplifier for a receiver receiving the signal of an underground transmitter used in underground boring equipment.

BACKGROUND OF THE INVENTION

Directional drilling, subsurface boring, microtunneling and the like share the objective of producing a hole beneath the surface of the earth in a carefully controlled manner. The hole is usually required for installation of tubular members such as pipes (for natural gas, petroleum fluids, steam, water, other gases and liquids, slurries, or sewer connections), protective conduits (for subsequent installation of electrical wires, cable television lines or fiber optic cable), for direct burial of electric wires and fiber optic cable, and the like. All such activities, particularly those in the top most one hundred feet or so of the subsurface, are described as subsurface boring.

Subsurface boring is increasingly important because it allows rapid placement or replacement of gas and water lines, sewers, electrical service, cable television service and similar utility connections with minimal disturbance of roads, landscaping, buildings, and other surface features. Subsurface boring allows placement of pipe and utility connections where conventional surface installation by trenching is impractical or impossible as, for example, when utility connections must cross rivers, canals, major highways, or rail lines. Significant practical and economic advantages are derived from the ability to provide pipe and utility connections with minimal surface disturbance or to provide subsurface crossing of surface barriers.

Locating and communicating with the boring tool are problems that must be solved to realize all advantages of subsurface boring. In many boring tool systems, a small transmitting device called a beacon is installed immediately behind the drill bit. The electromagnetic field generated by the subsurface beacon is detected at the surface using devices variously called trackers or locators. The beacon's electromagnetic field is often modulated to convey subsurface information from the beacon to the system operator. Beacon signal amplitudes, measured by one or a plurality of surface antennas, can be used to calculate distance between the beacon and the tracker or locator. Depending on beacon modulation details, the subsurface beacon transmits on or around one of several possible frequencies. It is common to allow operation at one of at least two different frequencies, thereby allowing two boring operations to proceed simultaneously in close proximity while still being able to differentiate between the two by using different beacon frequencies.

As operating depth increases, locating and communicating become increasingly difficult because, in the near field, signal amplitude decreases according to the third power of distance. As in any communication system, the signal-to-noise ratio is a primary determinant of success in signal estimation and communication. Beacon power is limited, hence available signal is limited. Accordingly, noise reduction assumes great importance. With limited signal power, the only way to improve the signal-to-noise ratio is to reduce the noise.

The noise figure of the receiving channel in the tracker or locator is determined largely by the preamplifier. Therefore, improvements in the preamplifier relating to signal handling and noise rejection are of great significance to the art.

U.S. Pat. Nos. 5,155,442 and 5,337,002 by Mercer, disclose locator equipment for detecting the magnetic field transmitted by a boring tool of the type that forms a horizontal bore under the surface of the earth. The locator equipment is either hand held, in which case it is maneuvered over the surface to detect the magnetic field transmitted by a small battery-operated transmitter carried by the boring tool, or it is surface mounted at some location determined by the equipment operator. The locator equipment includes a conventional parallel LC resonant circuit to selectively receive the fundamental frequency associated with roll/pitch information transmitted by the boring tool. The capacitor component of the resonant circuit is apparently variable to either change the resonant frequency of the receiver, or to change the resonant frequency to compensate changes due to aging, temperature, calibration, etc. The shortcomings of such an arrangement are noted below and are overcome by the present invention.

SUMMARY OF THE INVENTION

A bandpass preamplifier assembly is disclosed for use with a surface operated receiver having an antenna. For simplicity, all surface operated receivers will be lumped into the generic descriptor "locator." The antenna detects a transmitted signal from either an underground boring device or a signal impressed from a surface transmitter on an underground conductor operating at or around one of several possible characteristic frequencies. The maximum and minimum (or extrema) frequencies of the possible frequency set are the upper and lower cut-off frequencies, respectively. The preamplifier of the preferred embodiment includes a balanced bandpass filter incorporating the antenna as a filter inductance. The filter has a bandpass (or passband) sufficient to pass frequencies between the two spaced-apart frequencies, and attenuates frequencies beyond the upper and lower cut-off frequencies of the filter. A preferred embodiment amplifier is provided with a differential input, and the output of the bandpass filter is connected to the input of the amplifier. When utilizing the filter of the invention in a balanced configuration, the preamplifier assembly provides a high degree of common-mode rejection to extraneous signals induced into the filter circuits.

In accordance with another aspect of the present invention, the balanced bandpass filter is designed in accordance with the Butterworth type. In accordance with another aspect, the bandpass filter is a second order Butterworth filter which provides a high degree of rejection to out-of-band signal and noise frequencies. Yet another advantage of the passive filter of the invention is that of low power, low cost and low noise, which aspects are especially well adapted for use with battery operated underground beacon transmitters, and with battery operated surface locators. Another feature of the invention is that the antenna, the filter and the amplifier are packaged together as an integral module, and require no digital control leads which would otherwise carry noise signals that are characteristic of digital circuits.

BRIEF DESCRIPTION OF THE DRAWINGS

For a more complete understanding of the present invention and for further advantages thereof, reference is now made to the following description of the preferred embodiment taken in conjunction with the accompanying drawings, in which.

DETAILED DESCRIPTION OF THE INVENTION

Figure 1:
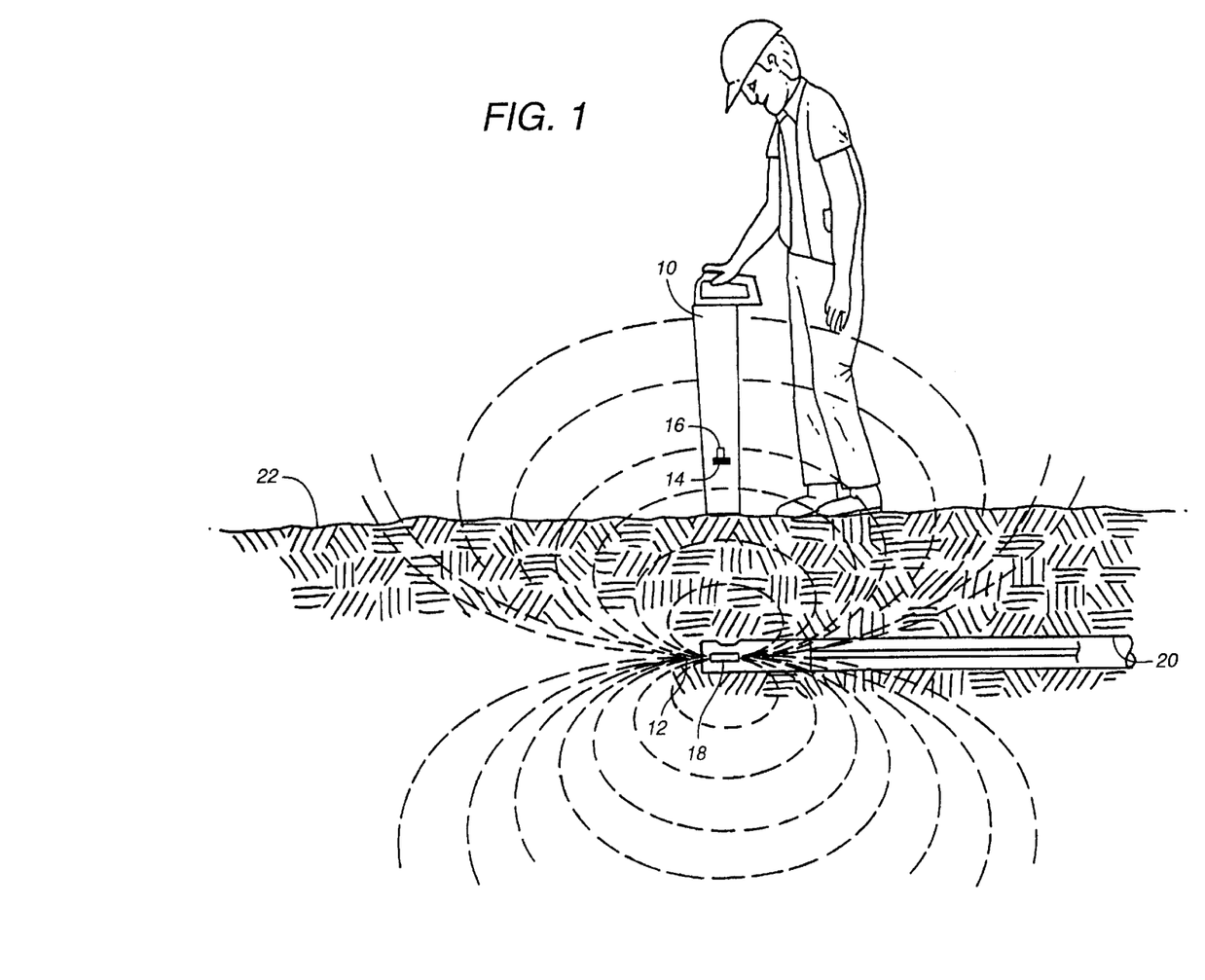
FIG. 1 is an illustrative view of a transmitter beacon and a locator employing the present invention.

With reference to FIG. 1, there is shown a locator 10 in an environment for locating an underground device, such as an underground boring tool 12. The locator 10 includes an antenna 14 and a preamplifier 16 for detecting the weak electromagnetic signals transmitted by a beacon 18 carried by the boring tool 12 as a bore 20 is formed horizontally under the surface of the ground 22. The signal received by the antenna 14 is encumbered with electromagnetic noise, and often the electromagnetic signal is weak because the boring tool 12 can operate fifty feet or more below the surface of the earth. Moreover, the beacon 18 is often battery operated and thus the transmitted signal strength is limited to allow sustained periods of underground operation. The earth itself may also attenuate the transmitted electromagnetic energy and thus reduce signal strength as a function of distance. It is well known that signal amplitude decreases according to the third power of distance. It can be seen that signal strength is of paramount importance when the transmitted signal itself is weak to begin with, due to self-contained battery operation of the underground beacon 18 located in the boring tool 12. Underground boring tools and associated beacons are disclosed in U.S. Pat. No. 5,133,417, by Rider,.and locator equipment and associated receiver circuits are disclosed in U.S. Pat. No. 5,264,795, by Rider. The disclosures of both such patents are incorporated herein by reference.

In designing a preamplifier assembly for a receiver locator or tracker 10 of the type for receiving the signal from an underground beacon 18, a number of factors are critical. Noise reduction is a primary objective of the locator analog signal path. Power consumption and physical volume are concerns of nearly equal importance. As will be discussed hereinafter, the preamplifier assembly constructed in accordance with the teachings of the present invention combines an instrumentation amplifier 16 and the antenna 14 of the locator 10 into a single modular unit, thereby reducing noise pick-up by providing local signal amplification before signals are routed to other electronic functional circuits.

Antennas for low frequency electromagnetic energy reception, whether of the air or ferrite core type, are modeled as inductors. In conventional practice, the antenna inductance and a capacitor form a parallel resonant circuit having maximum impedance at a frequency determined by the values of the antenna inductance and the resonating capacitance. Bandwidth about the resonant frequency is determined by the quality factor Q of the parallel circuit. Asymptotic noise rejection away from the resonant frequency is first order with a roll off of about =20 dBV/decade.

A circuit with high Q has a narrow bandwidth and strongly attenuates signals removed from the resonant frequency. This is ordinarily desirable, but extreme selectivity. (very high Q) can be disadvantageous. Temperature related component value changes (thermal drift) make the resonant frequency temperature dependent, with the result that a specific beacon frequency and the resonant frequency of the antenna circuit in the locator are neither constant nor optimally matched at all operating temperatures. Multi-frequency operation of such a unit is also difficult. If a beacon operating at one of a pair of possible frequencies is located at the resonant frequency of a parallel resonant circuit, the other beacon frequency is necessarily off-resonance and hence the response is attenuated. Placing the resonant frequency at the geometric mean or the simple mean beacon frequency provides relatively uniform response at both frequencies, but with possibly significant attenuation of both beacon signals. For a simple parallel LC circuit tuned to a mean frequency, signal attenuation increases as the difference between the frequencies increases. It is thus difficult to obtain an acceptable response to a pair of spaced-apart fundamental signals, using a first order parallel LC tuned circuit, without retuning the circuit for each frequency. The Q of a simple resonant circuit is often reduced or spoiled intentionally by adding resistance to the resonant circuit. Reduced circuit Q is known to alleviate the severity of the aforementioned problems, but does not eliminate the problems themselves.

The problem of matching a resonant frequency to a beacon frequency may be overcome by using multiple resonant circuits, switched tuning elements, computer controlled tuning elements, or other similar techniques. A processor-controlled antenna tuning circuit for underground locating equipment is disclosed in U.S. Pat. No. 5,231,355, by Rider, et al. The disclosure of such patent is incorporated herein by reference. Such conventional approaches achieve the desired goal of frequency selectivity at the expense of added components, costs, complexity and noise, and with a higher likelihood of component failure.

In one significant application according to the preferred embodiment, the locator 10 is to be used to detect beacon transmitters having at least two distinct extreme frequencies, namely at or around 29.430 KHz and 32.768 KHz. A simple parallel resonant circuit approach is not optimal for a locator to detect and process signals from beacons at either of these two frequencies which are spaced apart about 3.3 KHz. The geometric mean of the two beacon frequencies is 31.054 KHz. An ideal bandpass filter with a center frequency of 31.054 KHz and a bandwidth of approximately 3.5 KHz would pass both beacon frequencies, and any frequency therebetween, without attenuation and provide infinite out-of-band noise rejection. Although a mathematically ideal bandpass filter is unrealizable in practical circuits, a physically realizable narrow bandpass filter structure will provide excellent selectivity without elaborate tuning or switching schemes. A bandpass filter can present almost arbitrarily steep rejection to out-of-band signals by increasing the order of the lowpass filter prototype on which it is based. It is also appreciated that, as the order of the filter is increased to provide increased selectivity and reduced response to frequencies outside the band, the circuit complexity and cost increase correspondingly.

A key element of the locator 10 is the antenna 14. One typical antenna 14 used in the type of locator 10 of interest is a dual-winding bobbin formed around a ferrite rod or core.

In a typical antenna of this type, the antenna has a total inductance of approximately one Henry (H) at 31.054 KHz when the bobbin windings are series connected. The actual inductance is variable from antenna to antenna, being strongly dependent on the individual ferrite rod, the unique fabrication details of the individual bobbin windings, and the resulting antenna behavior due to self-resonant effects. For purposes of discussing a design hereinafter, an example of an antenna with total series inductance of 1.118 H composed of two equal and independent bobbin windings is assumed. In reality, it is difficult to characterize the inductance of a multiple winding antenna bobbin. A precise description must take into account distinctions to be made between the self-inductances of each bobbin winding and the mutual inductances shared by the bobbin windings. This is a nontrivial problem, compounded in difficulty by frequency dependent effects near self-resonance. Typical antennas having an inductance of 1.118 H at 31.054 KHz are self-resonant at approximately 38 KHz, which severely handicaps the design process. In addition, antenna inductance is often not even locally constant in the bandpass frequency range. However, the design process described hereinafter yields results useful as a first approximation to an end design.

Passive inductance-capacitance (LC) filters are commonly designed using data tabulated in reference materials. LC filter prototypes are commonly found in two forms: a capacitive input (probably the more commonly used) and an inductive input dual. Because the signal source for the preamplifier 16 is the inductive antenna element 14, the inductive dual form is employed. Furthermore, passive LC filter prototypes require known relationships between source and load impedances. In the preamplifier assembly 23 of the invention shown in FIG. 5, the antenna inductance 26 is part of filter 28 connected to the input of an instrumentation amplifier 16. The relatively low impedance of the antenna 14 produces induced signals which are filtered and connected to the very high impedance input of the instrumentation amplifier 16. Impedance mismatches greater than 20:1 are usually considered infinite, resulting in a normalized circuit model having zero source impedance and unit load impedance.

Figure 2:
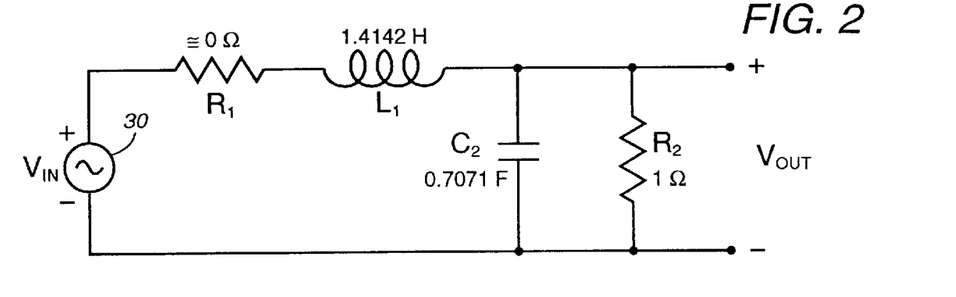
FIG. 2 is a schematic drawing of a normalized second order Butterworth low pass filter prototype.

Filter order and type (Butterworth, Bessel, Chevyshev, etc.) are matters of design choice. The preferred embodiment preamplifier assembly 23 is based on a Butterworth prototype to provide reasonable stop band roll-off with a maximally smooth passband. The uniformity of response at the various beacon frequencies is important. This fact makes the ripples inherent in Chevyshev, elliptic (Cauer), and certain other filter prototypes undesirable. FIG. 2 is schematic of the basic Butterworth second order (N=2) lowpass filter prototype with normalized component values, including a series resistance $R_1$ (approximately zero ohms in the normalized model) and series inductance $L_1$, a shunt capacitance $C_2$ and shunt resistance $R_2$. Voltage is applied to the circuit by a voltage generator 30 generating a voltage $V_{IN}$. The output of the circuit is taken across the resistor $R_2$ and is identified as $V_{out}$.

Based on the desired bandpass described above, one can assume operation of a bandpass filter with a 6 KHz is bandpass. This requires the lowpass filter prototype be frequency scaled to provide this 6 KHz bandwidth. The frequency scale factor (FSF) is given by the equation:

$$FSF = 2\pi(6000 \text{ Hz}) = 37.70 \times 10^3 \text{ rad/sec}$$

Reactive elements are divided by the FSF, whereas resistive elements (being independent of frequency) are not frequency scaled. The frequency scaled second order Butterworth circuit results in an inductance $L_1$ of 30.27 mH, a capacitance $C_2$ of 18.76 $\mu$F and a resistance $R_2$ of one $\Omega$. $R_1$ is negligible and assumed to be essentially zero $\Omega$.

Impedance scaling is carried out to achieve component values of practical sizes. As mentioned above, an actual antenna impedance is assumed to be approximately 1.118 H at 31.054 KHz. The frequency scaled inductance noted above is about 30.27 mH. Since antenna inductance is difficult to manipulate, it is normally necessary to impedance normalize other components to reconcile the inductances of the scaled filter and the antenna inductance. Hence, the impedance scaling factor Z is given by the equation:

$$Z = (1.118 \text{ H})/(30.27 \text{ mH}) = 36.93 \times 10^3$$

All elements thus require impedance scaling with respect to the antenna impedance. Inductors and resistors are multiplied by Z, whereas capacitors are divided by Z. The frequency and impedance scaled second order Butterworth lowpass circuit results in an inductance $L_1$ of the necessary 1.118 H, a capacitance $C_2$ of 508 pF and a resistance $R_2$ of 36.93 K$\Omega$.

Figure 3:
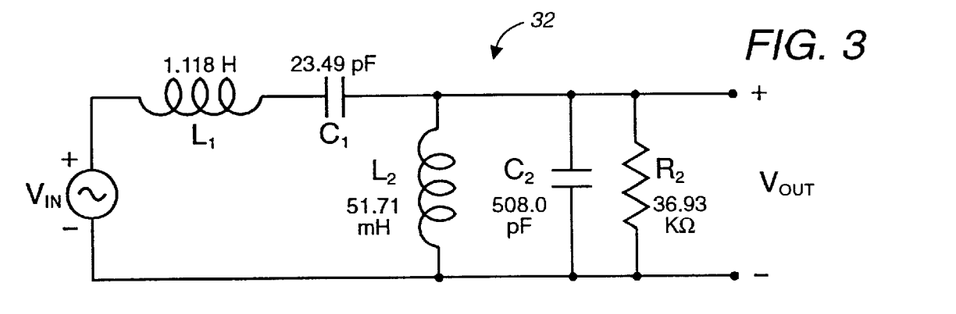
FIG. 3 is a schematic drawing of a single ended Butterworth prototype bandpass filter.

Transforming the lowpass prototype filter to a bandpass structure is accomplished by series resonating series branch reactances and parallel resonating shunt branch reactances at the geometric mean frequency of 31.054 KHz to form the second order bandpass filter 32 illustrated in FIG. 3. Filter 32 is a single ended filter, i.e., unbalanced with respect to the signal ground. The filter 32 includes series inductance $L_1$ and series capacitance $C_1$, shunt inductance $L_2$, shunt capacitance $C_2$, and shunt resistance $R_2$. Based on a geometric mean frequency of 31.054 KHz, $L_1$ is 1.118 H, $C_1$ is 23.49 pF, $L_2$ is 51.71 mH, $C_2$ is 508 pF and $R_2$ is 36.93 K$\Omega$.

Figure 4:
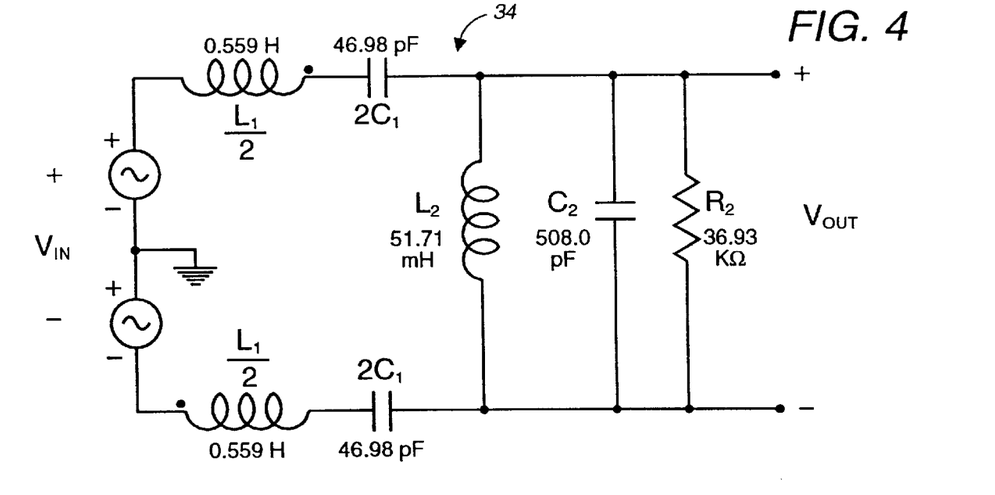
FIG. 4 is a schematic drawing of a passive Butterworth bandpass filter in a balanced configuration.

A passive filter configuration balanced with respect to circuit ground is obtained by recognizing that the circuit transfer function is preserved by dividing the series branch inductance $L_1$ by two and multiplying series branch capacitance $C_1$ by two, as illustrated in the second order Butterworth balanced bandpass filter 34 illustrated in FIG. 4. The balanced passive filter has a bandpass sufficient to accommodate a number of frequencies within the 6–7 KHz passband, without using multiple tuned circuits for a respective multiple number of frequencies, without using switched tuning elements, processor-controlled tuning or other more complicated active filter circuits. The second order passive filter according to the invention provides a =40 dBV/decade asymptotic rolloff, as compared to a =20 dBV/decade rolloff of a simple parallel resonant circuit, such as described in the Mercer patents identified above. The result is a balanced second order Butterworth bandpass filter which is optimal for rejection of common-mode noise by instrumentation amplifier 16. The phasing of the resulting inductance $L_1$, is shown by the dot convention, i.e., as series aiding.

Figure 5:
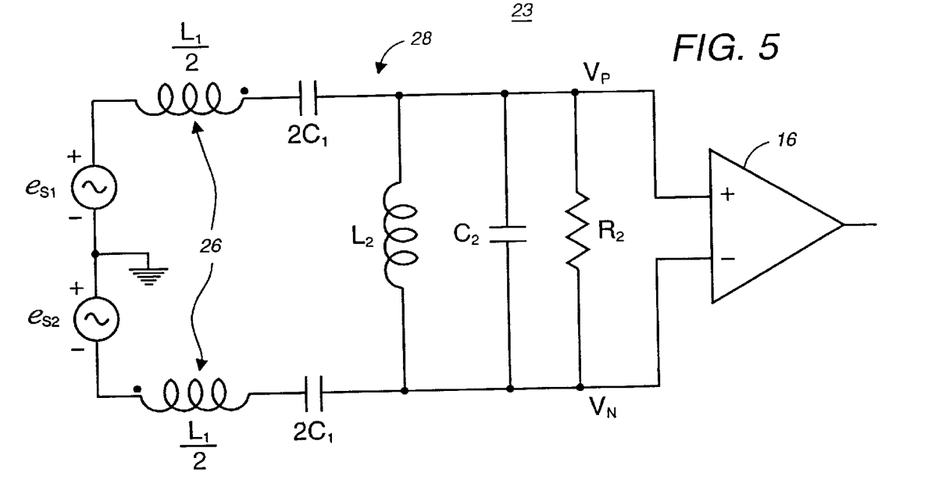
FIG. 5 is a schematic of a passive balanced bandpass filter constructed in accordance with the teachings of the present invention.

The completed preamplifier assembly 23 of the present invention is illustrated in FIG. 5. It is often useful to obtain an analytic transfer function in the Laplace transform domain using the Laplace transform variable $s=i2\pi f$. To make the required algebra manageable, two assumptions are important. The first assumption is that the total series-connected antenna inductance $L_1$ is equally divided between the two bobbin windings. The second assumption is that the two bobbin windings can be modeled by simple independent inductors. Self-resonant effects and winding resistance can be accommodated, at least in a local sense, by more complicated models. Given the difficulty of determining actual interrelationships between bobbin windings, a more complex model does not contribute a great deal of practical insight.

The instrumentation amplifier 16 input impedance is assumed to be resistive and significantly higher than the filter output impedance. Signal voltages $e_{S1}$ and $e_{S2}$ are induced in the windings of the antenna inductance $L_1$ by the electromagnetic field produced by the beacon signal. Although the beacon transmitter 18 may not transmit the plural frequencies simultaneously, such a transmitter is nevertheless adapted for transmitting plural frequencies. Surface-mounted locating transmitters are adapted for transmitting a number of different frequencies simultaneously. Under the assumption of using two equal and independent bobbin windings, antenna inductances in the balanced configuration are both one-half $L_1$. The bobbin windings are assumed to have no significant resistive losses, a condition reasonably approximated in practice. Similarly, the total antenna inductance $L_1$ is resonated by a series capacitance $C_1$ in the unbalanced model at about a midpoint frequency. The parallel resonant $L_2C_2$ circuit is resonant at about the same frequency that lies at the geometric mean between the extrema frequencies that are passed by the filter 34. The two series $L_1C_1$ circuits present a low impedance at the geometric mean frequency, while the parallel $L_2C_2$ circuit presents a high impedance at the geometric mean frequency. This balanced filter arrangement therefore provides a bandpass filter to pass the extrema frequencies and all the frequencies therebetween.

When the equivalent models are transferred to a balanced configuration, the capacitances required in the two series branches become $2C_1$. The transfer function relating the differential voltage $V_P-V_N$ across $R_2$, $L_2$ and $C_2$ resulting from the induced signal voltages $e_{S1}$ and $e_{S2}$ in the bobbin windings, is defined in accordance with the following:

$$\frac{V_P - V_N}{e_{s1} + e_{s2}} = \frac{(s^2 R_2 L_2 C_1)}{(s^4 R_2 L_1 C_1 L_2 C_2 + s^3 L_1 C_1 L_2 + s^2(R_2 L_1 C_1 + R_2 L_2 C_1 + R_2 L_2 C_2) + s^1 L_2 + R_2)}$$

Knowledge of the transfer function is useful for modeling circuit behavior once component values are known.

It is very useful to understand the relationships between circuit elements of the general circuit model of FIG. 5, tabulated element values of the lowpass prototype of FIG. 2 and critical frequency-domain descriptors. While the design procedure usually follows the nearly graphical steps used above, the individual transformations may be condensed to obtain the algebraic relationships which follow. The resulting values are good first approximations to practical design values.

| Definition of Variables: | |
|---|---|
| $f_{GM}$ | geometric mean frequency of bandpass filter. |
| $f_{BW}$ | –3 dBV bandwidth of bandpass section, also the –3 dBV bandwidth of the lowpass prototype. |
| FSF | frequency scaling factor: FSF = $2\pi f_{BW}$. |
| $L_{TAB}$ | tabulated inductance from Butterworth lowpass prototype. |
| $L_1$ | measured inductance of series-connected antenna coil. |
| $L_2$ | shunt branch inductance of balanced bandpass filter. |
| $C_{TAB}$ | tabulated capacitance from Butterworth lowpass prototype. |
| $C_1$ | capacitance required to resonate series-connected antenna inductance $L_1$. |
| $C_2$ | shunt branch capacitance of balanced bandpass filter. |
| $R_2$ | shunt branch resistance of balanced bandpass filter. |
| Z | impedance scaling factor. |

Impedance scaling factor Z is determined from the antenna inductance under the assumption that antenna inductance will be changed only under redesign or the like.

$$Z = \left(\frac{L_1}{L_{TAB}}\right) FSF,$$

where $$FSF = 2\pi f_{BW}$$

Knowing Z and FSF, circuit elements as shown in FIG. 4 are given by $$L_1 = \frac{L_{TAB} \cdot Z}{FSF}$$

$$C_1 = \left[\frac{1}{2\pi f_{GM} \sqrt{L_1}}\right]^2$$

$$R_2 = Z$$

$$C_2 = \frac{C_{TAB}}{FSF \cdot Z}$$

$$L_2 = \left[\frac{1}{2\pi f_{GM} \sqrt{C_2}}\right]^2$$

The preamplifier assembly 23 is preferably powered by batteries. This eliminates power supply noise, particularly high frequency switch mode power supply noise. For example, one circuit constructed in accordance with the teachings of the present invention employs two nine-volt alkaline batteries with a current drain of less than 0.3 mA from each of the batteries, resulting in a total nominal power consumption of only 5.4 mW. This arrangement, having a bandwidth between 6.5 KHz and 7 KHz, presents minimal attenuation to 29.430 and 32.768 KHz beacon frequencies, allows for some degree of passband thermal drift, and provides second order rejection of noise outside the passband. Primary causes of thermal drift are believed to be the temperature coefficient of the antenna ferrite rod and exaggerated changes in antenna inductance due to operation near antenna self resonance. These problems may be reduced by using MFG May 12, 1995 woven-wire Litz wire antenna bobbins MFG May 12, 1995 (rather than the 34 AWG copper wire presently utilized as the antenna coil windings) which nearly doubles the self-resonant frequency, by using air core antennas to eliminate the ferrite rod all together, and by using special winding techniques.

The preamplifier assembly 23 can be utilized to provide high gain (40 dBV or ×100 gain) with the noise reduction of a second or higher order bandpass amplifier. While a second order bandpass amplifier is disclosed herein, the filter order is a matter of choice. Higher order filters can be used to additionally improve rejection of out-of-band noise. Antenna inductance is incorporated in the filter as a circuit element, making all circuit values dependent on the antenna. In one filter constructed in accordance with the teachings of the present invention $C_1$=47 pF, $L_2$=47 mH, $C_2$=560 pF and $R_2$=30.1 KΩ. An instrumentation amplifier suitable for use with the passive balanced filter can be a 1NA118CP unit. This instrumentation amplifier provides a gain of about 100 (+40 dBV), and when coupled to a balanced bandpass filter described above, it attenuates any common-mode signals that are externally induced into the preamplifier assembly 23. The bandpass preamplifier assembly 23 of the present invention is well adapted for mass assembly and production without using high tolerance components. This advantage results in a lower cost unit that is reliable and provides excellent performance.

The method of design of an appropriate filter as described above is also presented in the book *Electronic Filter Design Handbook*, authored by Arthur B. Williams, copyright 1981, published by McGraw-Hill Book Company, ISBN 0-07-070430-9, the text of which is incorporated by reference herein in its entirety.

Figure 6:
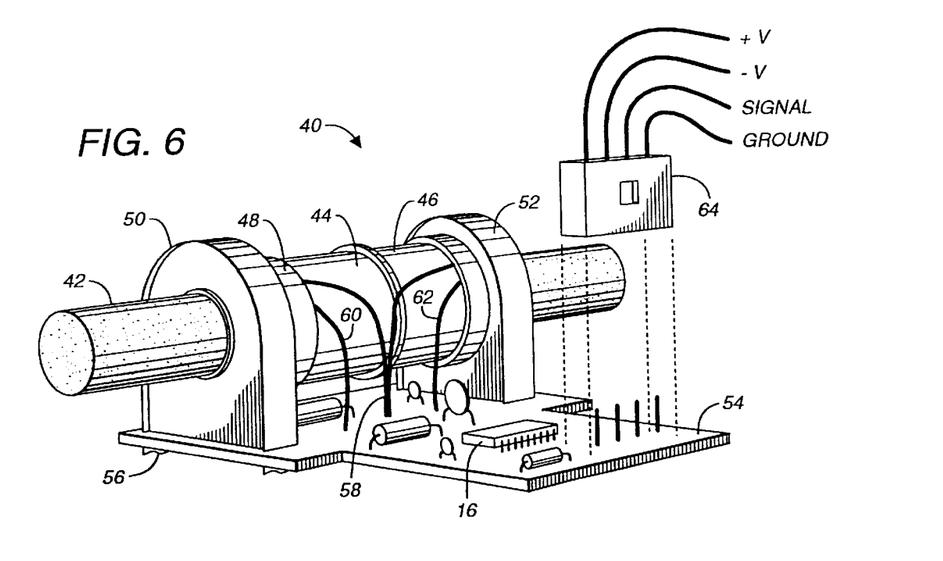
FIG. 6 is a drawing of the packaged module of the assembly of FIG. 5.

With reference to FIG. 6, there is illustrated the packaged module 40 comprising the bandpass preamplifier assembly according to the preferred embodiment of the invention. The preamplifier module 40 includes a ferrite core 42 around which are wrapped a first antenna coil 44 and a second antenna coil 46. The antenna coil windings 44 and 46 are each MFG May 12, 1995 wrapped around a plastic bobbin 48 having outside radial dividers, as well as a central radial divider for providing a pair of annular channels in which the conductors of the windings 44 and 46 can be wound. The bobbin 48 has a central bore therethrough to allow the ferrite rod 42 to extend therethrough. The coil windings 44 and 46, together with the ferrite core 42 function as an antenna to receive the electromagnetic energy transmitted by the beacon transmitter 18 of the underground boring tool 12. The ferrite rod 42 is attached at each end thereof to a vertical support 50 and 52, which supports provide a stand-off of the antenna structure from a printed circuit board 54. Indeed, the supports 50 and 52 are fastened to the printed circuit board 54 by way of plastic fasteners, such as shown by reference character 56. A pair of coil winding conductors 58 are connected together and to a circuit common connection of the printed circuit board 54. The other conductors 60 and 62 of the respective coil windings 40 and 46, are connected to series capacitors soldered to the printed circuit board 54, to form the pair of series resonant circuits. The other components of the filter 34 shown in FIG. 4, are also soldered to the printed circuit board 54. The instrumentation amplifier 16 is also mounted on the printed circuit board 54, with differential inputs connected to the balanced filter. A signal output of the instrumentation amplifier 16 as well as positive and negative supply voltage terminals, and a ground terminal, are the only conductors coupled to the module 40. The four conductors are connected to female sockets (not shown) formed in a plastic connector 64 which,. in turn, connects to a corresponding connector with contact pins (not shown), which are connected to the printed circuit board 54. In this manner, no digital signal leads are connected to the bandpass preamplifier assembly to thereby provide a source of noise to the preamplifier circuits. It can be appreciated that low level noise signals common to digital signal leads can adversely affect preamplifier circuits which have high gain factors and are designed for amplifying low level signals.

The preamplifier module 40 is packaged as a unitary module for easy mounting within a non-conductive case of a hand-held locator 10. Further, the bandpass nature of the assembly is well adapted for receiving plural frequencies of electromagnetic signals transmitted by underground beacon transmitters.

As noted above, a capacitive input filter can be easily designed by employing the dual analysis of the inductive input filter. Those skilled in the art, together with the textbook noted above, can configure a capacitive input filter for use with a capacitor plate type antennas to receive a band of electric field frequencies, rather than electromagnetic fields. For the same reasons that a capacitor is the dual of an inductor, and vice versa, an electric E-field is the dual of a magnetic H-field. Under a reasoning similar to the foregoing, but using the dual analysis, the capacitor of an antenna can be the electrical component as the input to the filter. This filter configuration is well adapted for sensing electric field frequencies within a band, such as for detecting electric fields emitting from underground boring tool transmitters.

The foregoing is directed to a preferred embodiment of the invention as utilized in conjunction with receivers for detecting the location of underground conductors, when amplitude modulated signals are radiated from the underground conductors and detected by surface locator receivers. It is to be understood that the invention can be utilized with no modulation at all, or with other modulation techniques such as frequency modulation, phase modulation, etc. The filter of the invention may also be employed with antennas having an air core, or a core material other than ferrite, and with one or more than two coil windings of the antenna.

Although the present invention has been described with respect to a specific preferred embodiment thereof, various changes and modifications may be suggested to one skilled in the art, and it is intended that the present invention encompass such changes and modifications as fall within the scope of the appended claims.

What is claimed is:

1. A bandpass preamplifier for a receiver having an antenna for detecting signals transmitted from an underground transmitting element, the receiver being operable for receiving a plurality of transmitted frequencies within a band with extrema characterized by a first characteristic frequency and a second characteristic frequency, comprising in combination:

a receiver for detecting said signals, said receiver including:

a balanced passive bandpass filter producing essentially a uniform passband response to frequencies between the first and second characteristic frequencies, said filter including;

a first and second series resonant circuit, each series resonant circuit having an inductor in series with a respective capacitor, said inductors for receiving transmitted frequencies, and said capacitors providing respective outputs of said first and second series resonant circuit, a parallel resonant circuit connected in parallel across respective outputs of said first and second series resonant circuits, an output of said parallel resonant circuit defining an output of said balanced passive bandpass filter; and a differential amplifier having inputs coupled to the output of said balanced passive bandpass filter.

2. The bandpass preamplifier of claim 1, wherein the inductors of said series resonant circuits have substantially identical values, and the capacitors of said series resonant circuits have substantially identical values.

3. The bandpass preamplifier of claim 1, wherein the balanced passive bandpass filter is of a Butterworth design having no variable or switchable components.

4. The bandpass preamplifier of claim 1, wherein each inductor of said series resonant circuits comprises an inductance of an antenna that detects signals transmitted from the underground transmitting element.

5. The bandpass preamplifier of claim 4, wherein said antenna inductors each include a ferrite core and said antenna inductors comprise a pair of windings connected in series.

6. The bandpass preamplifier of claim 4, wherein said balanced passive bandpass filter is an inductive input filter.

7. The bandpass preamplifier of claim 1, wherein the first characteristic frequency is less than 29.430 and the second characteristic frequency is greater than 32.768 KHz.

8. The bandpass preamplifier of claim 1, wherein the bandpass filter is designed in accordance with the following, where

| | |
|---|---|
| $f_{GM}$ | geometric mean frequency of bandpass filter. |
| $f_{BW}$ | −3 dBV bandwidth of a bandpass section of the filter, also the −dBV bandwidth of the lowpass prototype, |
| FSF | frequency scaling factor: FSF = $2\pi f_{BW}$, |
| $L_{TAB}$ | tabulated inductance from Butterworth lowpass prototype, |
| $L_1$ | measured inductance of series-connected antenna coil, |
| $L_2$ | shunt branch inductance of balanced bandpass filter, |
| $C_{TAB}$ | tabulated capacitance from Butterworth lowpass prototype, |
| $C_1$ | capacitance required to resonate series-connected antenna inductance $L_1$, |
| $C_2$ | shunt branch capacitance of balanced bandpass filter, |
| $R_2$ | shunt branch resistance of balanced bandpass filter, |
| Z | impedance scaling factor, and |

$$Z = \left(\frac{L_1}{L_{TAB}}\right) FSF,$$

$$FSF = 2\pi f_{BW}$$

$$L_1 = \frac{L_{TAB} \cdot Z}{FSF}$$

$$C_1 = \left[\frac{1}{2\pi f_{GM} \sqrt{L_1}}\right]^2$$

$$R_2 = Z$$

$$C_2 = \frac{C_{TAB}}{FSF \cdot Z}$$

$$L_2 = \left[\frac{1}{2\pi f_{GM} \sqrt{C_2}}\right]^2.$$

9. A bandpass preamplifier for a receiver having an antenna for detecting signals transmitted from an underground transmitting element operating at a plurality of frequencies with extrema characterized by a first characteristic frequency and a second characteristic frequency, comprising:
a balanced bandpass filter for receiving said plurality of frequencies, said balanced bandpass filter including,
an antenna inductance defined by a pair of series-connected coil windings, said coil windings having induced therein opposite polarity voltages as a result of electromagnetic signals transmitted by the underground transmitting element,
a pair of capacitors, each connected in series with a respective said coil winding,
a parallel inductor-capacitor resonant circuit connected between output terminals of said pair of capacitors; and a differential amplifier connected to the output terminals.

10. The bandpass preamplifier of claim 9, wherein said coil windings and said pair of capacitors define a pair of series resonant circuits.

11. The bandpass preamplifier of claim 10, wherein each said series resonant circuit resonates at a frequency substantially midway between the extrema frequencies.

12. The bandpass preamplifier of claim 11, wherein the parallel resonant LC circuit resonates at a frequency substantially midway between the extrema frequencies.

13. The bandpass preamplifier of claim 9, further including a resistor in parallel with the parallel resonant LC circuit to achieve a desired Q to the parallel resonant circuit.

14. The bandpass preamplifier of claim 9, wherein the inductance of each said coil winding is substantially the same value, and the pair of capacitors are of substantially the same value.

15. The bandpass preamplifier of claim 9, wherein a junction connection between the two coil windings is connected to a circuit common voltage.

16. A bandpass preamplifier, comprising:
an antenna for receiving electromagnetic radiations over a band of frequencies emitted from an underground transmitting element, said antenna including two windings each of substantially the same inductance, an end of each said winding being connected to a circuit common potential;
a balanced bandpass filter including a pair of series resonant LC circuits, the inductance of each said series resonant circuit including the inductance of one said antenna winding, the capacitors of said series resonant circuits producing an output of the balanced bandpass filter and producing differential filtered signals, a parallel resonant LC circuit bridged across the output of said bandpass filter, said balanced bandpass filter having components providing at the output thereof a maximally flat response across said band of frequencies, and at least a second order roll-off outside said band of frequencies; and
an amplifier having differential inputs for differentially amplifying the filtered signals output from the balanced bandpass filter, whereby an output signal amplitude of said amplifier is substantially independent of the frequency within said band of frequencies.

17. The bandpass preamplifier of claim 16, wherein said balanced bandpass is at least 3 KHz.

18. The bandpass preamplifier of claim 9, wherein said balanced bandpass filter is constructed only of passive components.

19. A method of fabricating a bandpass preamplifier for a receiver having an antenna for detecting signals transmitted from an underground transmitting element operating at a plurality of frequencies bounded by a first characteristic frequency and a second characteristic frequency, the method comprising the steps of:
constructing a passive passband filter for receiving said plurality of frequencies by using a pair of antenna inductors in series with a respective capacitor to form two series tuned circuits, with the series capacitors defining a differential output of the filter;
constructing a parallel LC tuned circuit and bridging the parallel tuned circuit across the filter differential output;
connecting the differential output of the filter to a differential input of a differential amplifier; and
packaging the antenna, the filter and the amplifier as a single unit for use with the receiver.

20. The method of claim 19, further including selecting passive components of the filter to achieve at least about a 6.5 KHz bandwidth at frequencies in the range of about 28 KHz to about 33 KHz.

21. The method of claim 19, further including connecting the antenna inductors directly together in series aiding.

22. The method of claim 19, further including providing only power, ground and signal wires to the package, without any digital control wires.

23. The method of claim 19, further including operating the receiver with a DC battery to power the amplifier, and operating the receiver to detect electromagnetic signals transmitted from an underground boring device having a beacon transmitter adapted to transmit plural frequencies within the bandwidth of the filter of the receiver.

24. The bandpass preamplifier of claim 16, wherein said balanced bandpass filter is constructed only of passive components.

* * * * *